United States Patent [19]
Yoon

[11] Patent Number: 5,568,139
[45] Date of Patent: Oct. 22, 1996

[54] APPARATUS FOR PARALLEL DECODING OF VARIABLE LENGTH ENCODED IMAGE SIGNALS

[75] Inventor: Sang-Ho Yoon, Seoul, Rep. of Korea

[73] Assignee: Daewoo Electronics Co., Ltd., Seoul, Rep. of Korea

[21] Appl. No.: 264,406

[22] Filed: Jun. 23, 1994

[30] Foreign Application Priority Data

Jun. 23, 1993 [KR] Rep. of Korea .................. 1993-11547

[51] Int. Cl.$^6$ .................................................. H03M 7/40
[52] U.S. Cl. ................................................ 341/67
[58] Field of Search ................................. 341/67

[56] References Cited

U.S. PATENT DOCUMENTS

| | | | |
|---|---|---|---|
| 5,138,315 | 8/1992 | LeQueau et al. | 341/67 |
| 5,216,503 | 1/1993 | Paik et al. | 358/133 |
| 5,239,308 | 8/1993 | Keesen | 341/67 |
| 5,386,212 | 1/1995 | Shen | 341/67 |
| 5,386,213 | 1/1995 | Haupt | 341/67 |

FOREIGN PATENT DOCUMENTS 3-23720  1/1991  Japan ...................... 341/67

OTHER PUBLICATIONS

Hidenori Okuda et al., "A Concurrent Decoding Scheme for Multiple Motion Videos" Jun. 1991, ICC. 91, International Conference on Communication pp. 501–505 Jun. 1991.

Note "AL" Above Not Seen or Considered by Examiner TLG.

Primary Examiner—Brian K. Young
Attorney, Agent, or Firm—Anderson, Kill, Olick P.C.

[57] ABSTRACT

In an apparatus for the parallel decoding of encoded image signals separated into variable length encoded blocks, wherein the encoded blocks are distributed over N buffer memories included in N parallel decoding paths at a demultiplexor, a provisional buffer memory circuit is provided between the demultiplexor and the N buffer memories. The circuit serves to, upon receiving an encoded block destined to one of the N buffer memories, temporarily hold the received block therein until the designated buffer memory becomes available for the received block. However, when the designated buffer memory is immediately available for the received block, the circuit dispatches it to the buffer memory without such temporary holding.

10 Claims, 3 Drawing Sheets

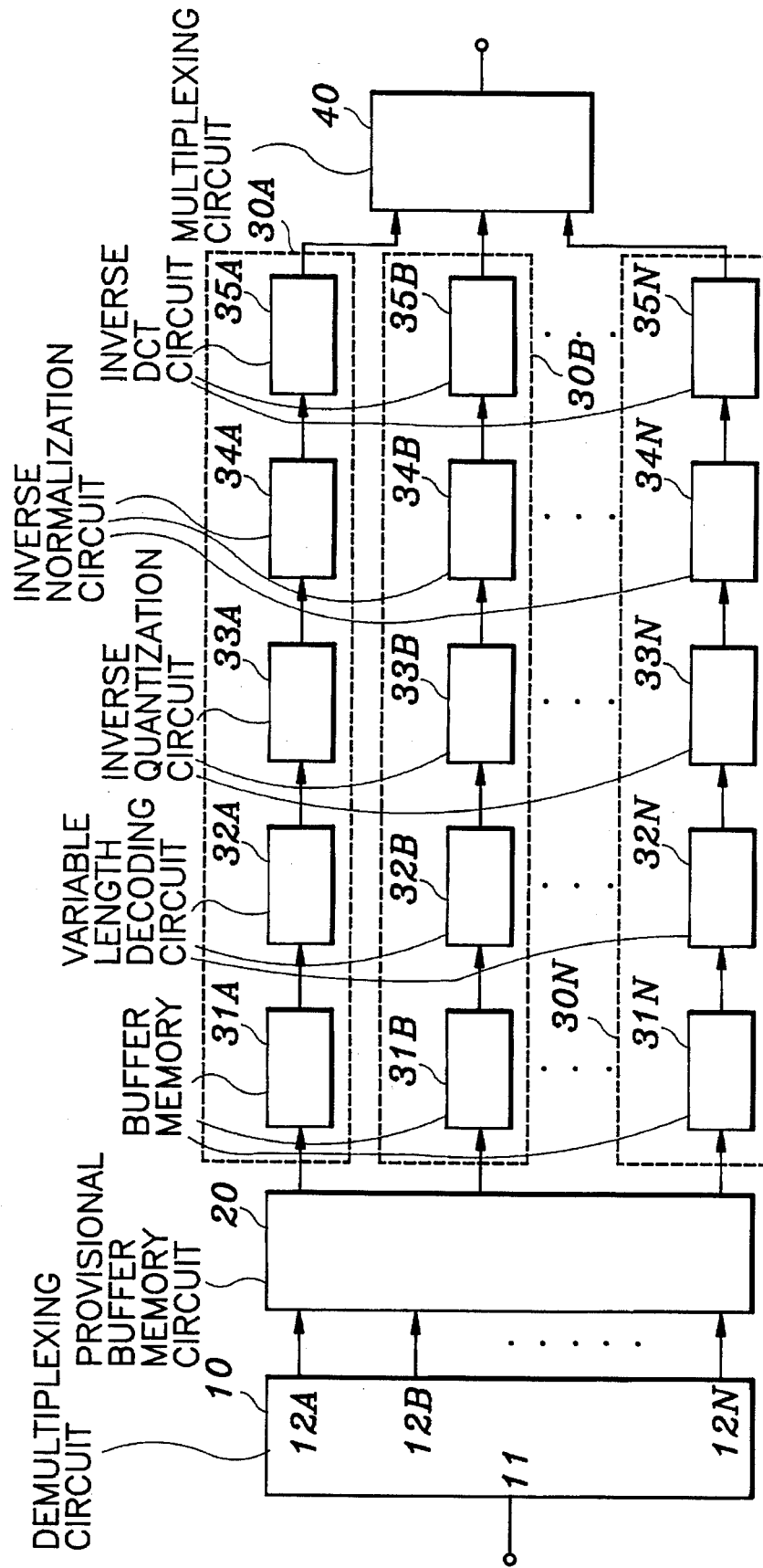

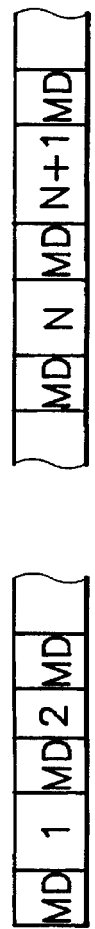
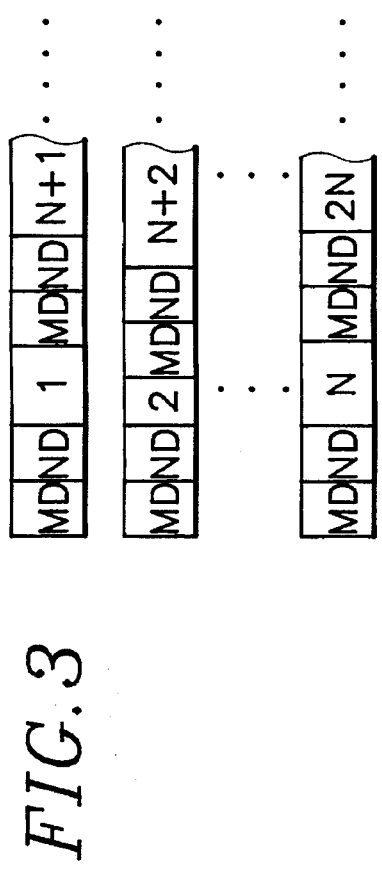
FIG.2a
FIG.2b
FIG.3

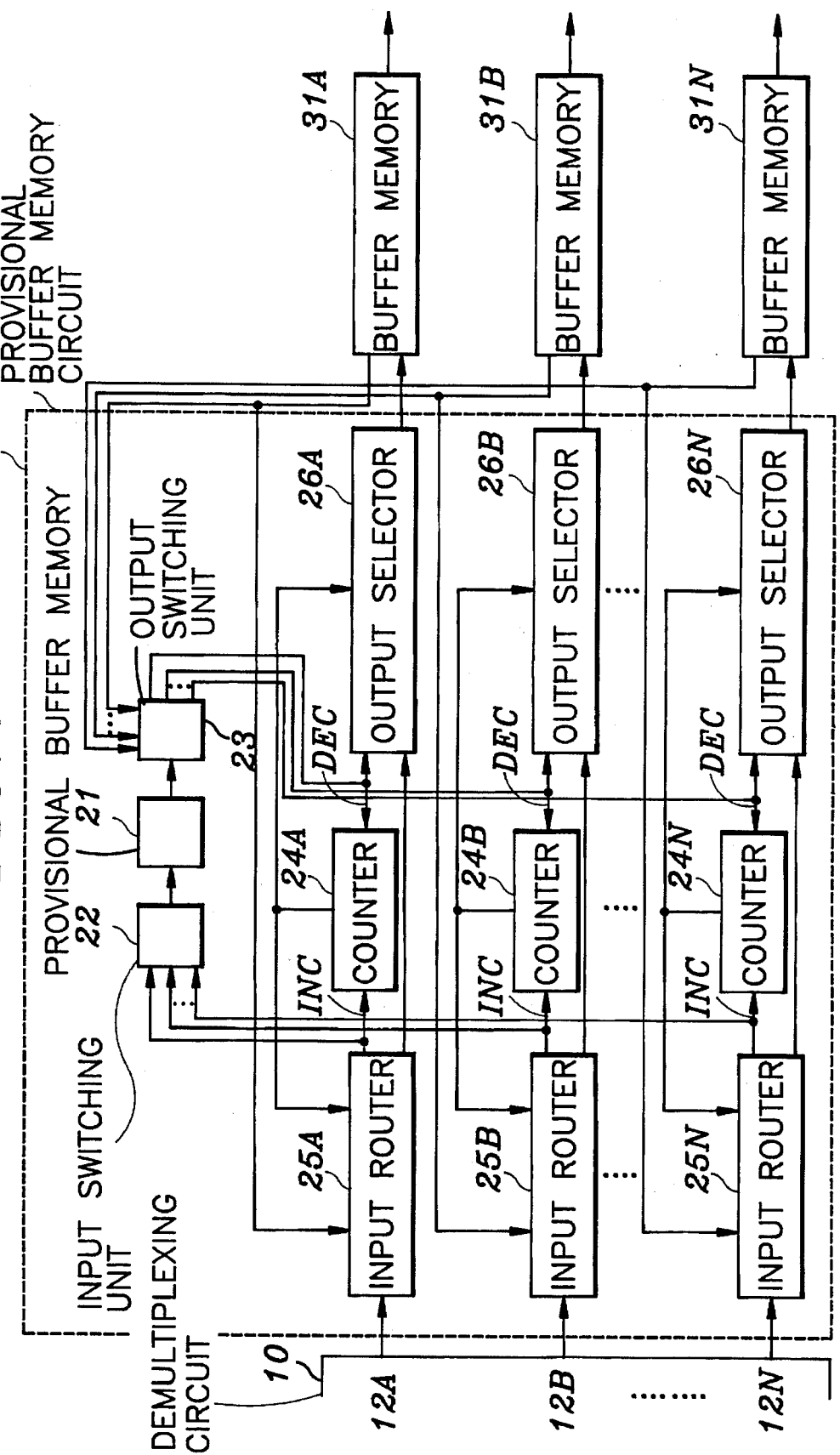

APPARATUS FOR PARALLEL DECODING OF VARIABLE LENGTH ENCODED IMAGE SIGNALS

FIELD OF THE INVENTION

The present invention relates to a decoding apparatus; and, more particularly, to an apparatus for the parallel decoding of variable length encoded image signal with N parallel processing paths.

DESCRIPTION OF THE PRIOR ART

In various electronic/electrical applications such as high definition television and video telephone systems, an image signal may need be transmitted in a digitized form. When the image signal is expressed in a digitized form, there is bound to occur a substantial amount of digital data. Since, however, the available frequency bandwidth of a conventional transmission channel is limited, in order to transmit the image signal therethrough, the use of an image signal encoding apparatus often becomes necessary to compress the substantial amounts of digital data.

Accordingly, most image signal encoding apparatus of prior art employ various compression techniques (or coding methods) built on the idea of utilizing or reducing spatial and/or temporal redundancies inherent in the input image signal.

An example of such prior art image signal encoding apparatus can be found in, e.g., U.S. Pat. No. 4,394,774. According to an embodiment of the encoding apparatus of this patent, input image signals, which have previously been decomposed into blocks of a size appropriate for data compression, successively traverse, on a block-by-block basis, a discrete cosine transform circuit, a normalization circuit, a quantization circuit, and a variable length encoding circuit, with which a desired compression rate can be obtained. The output signals of the variable length encoding circuit (i.e., encoded blocks) are then applied to a rate control circuit having a buffer memory. At the output of this circuit, a transmission channel extracts, at a fixed frequency, the encoded blocks stored in said buffer memory to form an encoded bit stream. Simultaneously, the quantization step is controlled by the filling state of this buffer memory in such a way that the buffer memory is never completely filled or completely emptied.

The decoding of the image signals so encoded is an inverse process of the encoding operation. Specifically, as the transmission channel fills the buffer memory in a decoding apparatus at a constant rate with the encoded bit stream, the decoding apparatus comprising a variable length decoding circuit, an inverse quantization circuit, an inverse normalization circuit and an inverse discrete cosine transform circuit, reads this buffer memory and decodes the encoded blocks present in the encoded bit stream to thereby reconstruct the entire original image signals.

When high performance and/or high speed processing is to be carried out to meet a required data rate in an, e.g., image signal decoding apparatus, it may be desirable to use the technique of parallel processing. In an image signal decoding apparatus having the parallel processing capability, the successive encoded blocks in the encoded bit stream can be, on a block-by-block basis, demultiplexed and applied to N parallel processing paths. Said N paths may be preferably identical and independent: each of them may comprise a buffer memory, a variable length decoder, an inverse quantization circuit, an inverse normalization circuit and an inverse discrete cosine transform circuit; and function as the already described decoding apparatus for its demultiplexed blocks. The output signals from the N paths are then multiplexed to form a single data stream representing the original image signals to be, e.g., displayed on a display device.

However, in such parallel decoding apparatus of variable length encoded image signals, the overall storage capacity of the buffer memories required in the paths tends to increase beyond that of the buffer memory of an equivalent decoding apparatus having a serial structure, as will be described hereinbelow.

Specifically, assuming that the reference NC denotes the minimum storage capacity which would be required for the buffer memory of the equivalent serial decoding apparatus which is to operate at the same operating frequency as that of the parallel decoding apparatus, in case of the parallel decoding apparatus, the minimum storage capacity of the buffer memory in each one of the N paths may theoretically be reduced to NC/N=C owing to the demultiplexing of the encoded blocks over the N buffer memories.

In practice, however, it is virtually impossible to attain such a value due to the variable length nature of the encoded blocks demultiplexed over the N paths. Consequently, after the demultiplexing, the demultiplexed blocks may be distributed quite unevenly over these paths and eventually over the N buffer memories. As an extreme case, the total encoded information could be concentrated in a single path, while the (N−1) other paths and their buffer memories would be in an idle state. Accordingly, in order to realize the parallel decoding operation optimally (i.e., without an overflow error in any of the N buffer memories), it may even be required that each one of the N buffer memories have a minimum storage capacity which is equal to NC rather than C. The result is that the buffer memories of the parallel decoding apparatus have an overall storage capacity of N×N× C=$N^2$C, which is N times larger than in the case of the equivalent serial decoding apparatus where the storage capacity value is NC.

In U.S Pat. No. 5,138,315, there is proposed an arrangement for variable length encoding of image signals, divided into N parallel processing paths, wherein a minimum buffer memory storage capacity proximate to that of the equivalent serial encoding apparatus can be obtained. The encoding arrangement comprises a routing circuit arranged between variable length encoding means and rate control means having N buffer memories, which, after classification of the variable length encoded blocks in accordance with their increasing or decreasing lengths and the classification of the buffer memories in accordance with their decreasing or increasing filling states, apply the encoded blocks to the buffer memories which are less filled as the encoded blocks are longer, resulting in an even distribution of the variable length encoded blocks over the buffer memories. The corresponding decoding arrangement, which receives said encoded image signals in regrouped blocks accompanied by a respective path indicator for said blocks, comprises, at the output of its N parallel processing paths, a circuit for routing said blocks as a function of the associated path indicator.

According to the teachings of this patent, while a minimum buffer memory storage capacity proximate to that of the equivalent serial decoding apparatus can be obtained for a structure having N parallel variable length decoding paths, a decoder of this type can only be used with an encoding apparatus having the above described routing feature.

SUMMARY OF THE INVENTION

It is, therefore, a primary object of the invention to provide an apparatus for the parallel decoding of variable length encoded image signals, divided into N parallel processing paths, wherein the overall storage capacity of the buffer memories provided in the N parallel processing paths can be kept as small as possible, without imposing any special constraint on the corresponding conventional encoding apparatus.

In accordance with the present invention, there is provided an apparatus for the parallel decoding of encoded image signals supplied in the form of an encoded bit stream separated in variable length encoded blocks, said apparatus comprising:

a circuit having a single input terminal and N output terminals for receiving the encoded bit stream through the single input terminal, and demultiplexing said blocks in the encoded bit stream over the N output terminals;

N parallel processing paths, each including a buffer memory for respectively performing decoding operation including variable length decoding on said blocks provided in the buffer memory; and a provisional buffer memory circuit connected between the N output terminals and the N buffer memories for temporarily storing said blocks to be applied to a respective one of the N buffer memories when said respective one of the N buffer memories is in a buffer full state, and providing said blocks to said respective one of the N buffer memories as said respective one of the buffer memories has been released from the buffer full state.

BRIEF DESCRIPTION OF THE DRAWINGS

The above and other objects and features of the present invention will become apparent from the following description of preferred embodiments given in conjunction with the accompanying drawings, in which:

FIG. 1 shows a particular embodiment of a parallel decoding apparatus of the present invention;

FIG. 2a depicts an abstract of the sequence of signals at the input of a conventional image signal encoding apparatus in the form of blocks separated in regular intervals by special words $M_E$;

FIG. 2b presents an abstract of the sequence of corresponding blocks at the output of the conventional image signal encoding apparatus in the form of variable length encoded blocks separated by special words $M_D$ corresponding to the words $M_E$;

FIG. 3 illustrates an abstract of the N sequences of the corresponding blocks at the output of the demultiplexing circuit of the parallel decoding apparatus of FIG. 1, with a path indicator $N_D$ attached to each demultiplexed block; and FIG. 4 represents an embodiment of the provisional buffer memory circuit of the parallel decoding apparatus of FIG. 1

DETAILED DESCRIPTION OF THE PREFERRED EMBODIMENTS

Referring first to FIG. 1, there is shown an embodiment of the inventive apparatus for the parallel decoding of variable length encoded image signals in accordance with the present invention.

As shown in FIG. 1, the parallel decoding apparatus of the present invention comprises the following elements in this embodiment. A demultiplexing circuit 10 receives encoded image signals from the corresponding conventional encoding apparatus (not shown).

In the encoding apparatus, input image signals, which are originally presented in the form of a continuous flow of bits, are typically separated at regular intervals by special words $M_E$ cutting up this flow into blocks of a fixed length as illustrated in FIG. 2a, and processed as such. In case of encoding television signals, for example, the continuous flow is cut up into, e.g., blocks of eight consecutive picture lines.

At the output of the encoding apparatus, encoded image signals are provided in the form of an encoded bit stream arranged in variable length code words describing the blocks. As shown in FIG. 2b, these blocks are separated from each other by special words $M_D$ corresponding to words $M_E$ of FIG. 2a.

Returning to FIG. 1, the demultiplexing circuit 10 having a single input terminal 11 and N output terminals 12A to 12N receives these encoded image signals through the single input terminal 11 and demultiplexes them, on a block-by-block basis, over N parallel processing paths 30A to 30N through the N output terminals 12A to 12N, with a respective path indicator $N_D$ associated with each demultiplexed block as illustrated in FIG. 3. These N paths 30A to 30N, which are provided for performing the inverse operations of those effected by the encoding apparatus (i.e., decoding operation), each may comprise a buffer memory, e.g., 31A, a variable length decoding circuit, e.g., 32A, an inverse quantization circuit, e.g., 33A, an inverse normalization circuit, e.g., 34A, and an inverse discrete cosine transform circuit, e.g., 35A, as a conventional apparatus; and performs the decoding operation on its demultiplexed blocks stored in its buffer memory.

The output signals from the N paths 30A to 30N are then multiplexed by a multiplexing circuit 40 to form a single data stream representing the original image signals to be, e.g., displayed on a display unit (not shown).

Connected between the N output terminals 12A to 12N of the demultiplexing circuit 10 and the N buffer memories 31A to 31N of the N paths 30A to 30N is a provisional buffer memory circuit 20 of the present invention which will be described with reference to FIG. 4. As will be described below, with the aid of the provisional buffer memory circuit 20 of the present invention, the storage capacity of each of the N buffer memories can be kept less than the above-mentioned storage capacity of NC, resulting in an overall storage capacity of the N buffer memories far less than $N^2C$.

As shown in FIG. 4, the provisional buffer memory circuit 20 includes a provisional buffer memory 21 having a storage capacity of, at most, said NC (actual NC value can be determined depending on the throughput of the N parallel processing paths and the input rate of the encoded image signals), connected with a built-in input switching unit 22 at its input end and a built-in output switching unit 23 at its output end, and, per each path, e.g., 30A, a counter 24A which counts the number of the demultiplexed blocks having been received from the respective output terminal 12A and currently being held in the provisional buffer memory 21; an input router 25A which receives the demultiplexed blocks from the respective output terminal 12A and forwards the received blocks, on a block-by-block basis, either to the built-in input switching unit 22 of the provisional buffer memory 21 or to an output selector 26A depending on a buffer full signal from the respective buffer memory 31A and the current value of the counter 24A; and the output selector 26A which connects the respective buffer memory 31A either with the output switching unit 23 of the provisional buffer memory 21 or with the input router 25A depending on the current value of the counter 24A. (As all of the counters 24A to 24N together with their associated input routers 25A to 25N and output selectors 26A to 26N are identical, the description will be given with respect to the counter 24A, input router 25A and output selector 26A only.)

As such, when a demultiplexed block is first received, the input router 25A checks the buffer full signal from the respective buffer memory 31A and the current value of the counter 24A. When the buffer full signal is asserted, it can be recognized that the respective buffer memory 31A is in a buffer full state; and thus has no room to accommodate the received block. Further, when the counter value is not zero (0), it can be recognized that there is the corresponding number of previously received blocks in the provisional buffer memory 21, to be applied to the respective buffer memory 31A ahead of the presently received block.

Accordingly, when the buffer full signal is asserted or the counter value is not zero, the input router 25A forwards the presently received block to the corresponding input of the built-in input switching unit 22; and, in response to such forwarding, the counter 24A increments its value. At the built-in input switching unit 22, this presently received block will be fed into the provisional buffer memory 21 as the path indicator thereof is used as the switching control signal to set up the connection between the input router 25A and the provisional buffer memory 21. As a result, in the provisional buffer memory 21, the presently received block would be accommodated together with previously stored blocks, if any, that had been forwarded by the input routers 25A to 25N in a like manner, and then outputted in a first-in-first-out manner.

Eventually, when the presently received block is present at the output of the provisional buffer memory 21, the presently received block, eliminated with the path indicator thereof, will be forwarded by the built-in output switching unit 23 to the output selector 26A as the respective buffer memory 31A has been released from the buffer full state and the eliminated path indicator is used as the output switching control signal to set up the connection between the provisional buffer memory 21 and the output selector 26A; and, in response to such forwarding, the counter 24A will decrement its value.

On the other hand, at the input router 25A, if the buffer full signal is not asserted and, simultaneously, the counter value is zero when the demultiplexed block is received, it can be recognized that the respective buffer memory 31A is not in a buffer full state, and also there is no previously received blocks in the provisional buffer memory 21, to be applied to the respective buffer memory 31A ahead of the presently received block. Therefore, the input router 25A will forward the presently received block directly to the output selector 26A.

In the meantime, the output selector 26A determines whether the current value of the counter 24A is zero or not. When the counter value is not zero, it can be recognized that there exists the corresponding number of received blocks in the provisional buffer memory 21, to be applied to the respective buffer memory 31A. Therefore, when the counter value is not zero, the output selector 26A connects the respective buffer memory 31A with the corresponding output of the built-in output switching unit 23. Otherwise, the output selector 26A connects the respective buffer memory 31A with the input router 25A.

Consequently, as would be readily apparent to those skilled in the art, with the aid of the provisional buffer memory circuit 20 including a provisional buffer memory whose storage capacity is, at most, said NC, the apparatus of the present invention can perform the decoding operation optimally with N buffer memories each having less storage capacity than said NC, employed in N parallel processing paths, still without imposing any special constraint on the corresponding encoding apparatus, which constitutes a remarkable improvement over the prior art parallel decoding apparatus which requires the overall buffer memory storage capacity of $N^2C$ and also over the parallel decoding apparatus disclosed in U.S. Pat. No. 5,138,315 which demands a specific parallel encoding apparatus.

While the present invention has been shown and described with reference to the particular embodiments, it will be apparent to those skilled in the art that many changes and modifications may be made without departing from the spirit and scope of the present invention as defined in the appended claims. For example, although the parallel decoding apparatus of the present invention has been described as to perform the decoding operation on image signals encoded by a intra coding scheme, it would be appreciated to those skilled in the art that the apparatus may be easily adapted to decode image signals encoded by using a, e.g., hybrid coding scheme by way of incorporating a frame store and predictor between the N parallel processing paths and the multiplexing circuit shown in FIG. 1.

What is claimed is:

1. An apparatus for the parallel decoding of encoded image signals supplied in the form of an encoded bit stream separated in variable length encoded blocks, said apparatus comprising:

a circuit having a single input terminal and N output terminals for receiving the encoded bit stream through the single input terminal, and demultiplexing said blocks in the encoded bit stream over the N output terminals;

N parallel processing paths, each including a buffer memory for respectively performing decoding operation including variable length decoding on one or more of said blocks provided in its buffer memory; and a provisional buffer memory circuit connected between the N output terminals and the N buffer memories for, upon receiving one of said blocks to be applied to one of the N buffer memories from one of the N output terminals, either temporarily storing said received block in the provisional buffer memory circuit when said one of the N buffer memories is in a buffer full state or when there exist one or more blocks to be applied to said one of the N buffer memories ahead of said received block in the provisional buffer memory circuit, or directly providing said received block to said one of the N buffer memories without such temporary storage, if otherwise.

2. The parallel decoding apparatus of claim 1, further comprising a circuit for multiplexing output signals from the N parallel processing paths into a single data stream.

3. The parallel decoding apparatus of claim 2, wherein each of the N parallel processing paths further includes a variable length decoding circuit, an inverse quantization circuit, an inverse normalization circuit and an inverse discrete cosine transform circuit.

4. The parallel decoding apparatus of claim 1, wherein the provisional buffer memory circuit includes:

1) a provisional buffer memory operating in a first-in-first-out manner; and

2) N routing circuits connected between the N output terminals and the N buffer memories, each routing circuit having:

a) input routing means for, upon receiving one of said blocks from a respective one of the N output terminals, providing said presently received blocks either to the provisional buffer memory for storage therein when a respective one of the N buffer memories is in a buffer full state or when there exist one or more of said blocks previously received from the respective one of the N output terminals and currently stored in the provisional buffer memory, or to the respective one of the N buffer memories otherwise; and b) output selecting means for connecting the respective one of the N buffer memories either with the provisional buffer memory when there exist said presently received block or said previously received blocks currently stored in the provisional buffer memory, or with the input routing means otherwise.

5. The parallel decoding apparatus of claim 4, wherein each of the N buffer memories has a storage capacity less than that of the provisional buffer memory.

6. The parallel decoding apparatus of claim 3, wherein the provisional buffer memory circuit includes:

1) a provisional buffer memory operating in a first-in-first-out manner; and

2) N routing circuits connected between the N output terminals and the N buffer memories, each routing circuit having:

a) input routing means for, upon receiving one of said blocks from a respective one of the N output terminals, providing said presently received blocks either to the provisional buffer memory for storage therein when a respective one of the N buffer memories is in a buffer full state or when there exist one or more of said blocks previously received from the respective one of the N output terminals and currently stored in the provisional buffer memory, or to the respective one of the N buffer memories otherwise; and b) output selecting means for connecting the respective one of the N buffer memories either with the provisional buffer memory when there exist said presently received block or said previously received blocks currently stored in the provisional buffer memory, or with the input routing means otherwise.

7. The parallel decoding apparatus of claim 6, wherein each of the N buffer memories has a storage capacity less than that of the provisional buffer memory said NC, wherein said NC represents the minimum storage capacity of an equivalent decoding apparatus having a serial structure, which is to operated at the same operating frequency as that of the parallel decoding apparatus.

8. An apparatus for the parallel decoding of encoded image signals supplied in the form of an encoded bit stream separated into variable length encoded blocks, comprising:

demultiplexor means having an input terminal and N output terminals for receiving the encoded bit stream through the input terminal, and demultiplexing said blocks in the encoded bit stream over the N output terminals;

N parallel processing path means, each having a buffer memory for respectively performing decoding operation including variable length decoding on one or more of said blocks provided in its buffer memory; and provisional buffer memory means arranged between the N output terminals and the N buffer memories for, upon receiving one of said blocks to be applied to one of the N buffer memories from one of the N output terminals, temporarily storing said received block therein until said one of the N buffer memories becomes available for said received block, or providing said received block to said one of the N buffer memories without such temporary storage if said one of the N buffer memories is immediately available for said received block.

9. The parallel decoding apparatus of claim 8, wherein said one of the N buffer memories becomes available for said received block when said one of the N buffer memories is not in a buffer full state with no block in the provisional buffer memory circuit pending entry into said one of the N buffer memories.

10. The parallel decoding apparatus of claim 9, wherein each of the N buffer memories has a storage capacity less than that of the provisional buffer memory means.

* * * * *